US011022637B2

(12) United States Patent
Yanamadala et al.

(10) Patent No.: US 11,022,637 B2
(45) Date of Patent: Jun. 1, 2021

(54) DETECTION OF PULSE WIDTH TAMPERING OF SIGNALS

(71) Applicant: Arm Limited, Cambridge (GB)

(72) Inventors: Subbayya Chowdary Yanamadala, Dallas, TX (US); Mikael Yves Marie Rien, Bernin (FR)

(73) Assignee: ARM LIMITED, Cambridge (GB)

( * ) Notice: Subject to any disclaimer, the term of this patent is extended or adjusted under 35 U.S.C. 154(b) by 188 days.

(21) Appl. No.: 16/244,364

(22) Filed: Jan. 10, 2019

(65) Prior Publication Data

US 2020/0225270 A1    Jul. 16, 2020

(51) Int. Cl.
| | | |
|---|---|---|
| *G01R 29/02* | (2006.01) | |
| *G01R 31/28* | (2006.01) | |
| *G01R 31/317* | (2006.01) | |
| *G01R 31/3185* | (2006.01) | |

(52) U.S. Cl.
CPC .......... *G01R 29/023* (2013.01); *G01R 29/02* (2013.01); *G01R 31/2882* (2013.01); *G01R 31/31719* (2013.01); *G01R 31/318588* (2013.01)

(58) Field of Classification Search
CPC ...... G01R 29/00; G01R 29/02; G01R 29/023; G01R 31/00; G01R 31/28; G01R 31/2851; G01R 31/2882; G01R 31/317; G01R 31/31719; G01R 31/3181; G01R 31/3185; G01R 31/318533; G01R 31/318583; G01R 31/318588
USPC ......... 324/76.11, 76.12, 76.39, 98, 600, 602, 324/605, 606, 629, 647
See application file for complete search history.

(56) References Cited

U.S. PATENT DOCUMENTS

| | | | |
|---|---|---|---|
| 7,080,001 B2* | 7/2006 | Moriyama | G06F 21/55 713/600 |
| 10,753,966 B2* | 8/2020 | Wiezell | G01R 29/0273 |
| 2004/0117693 A1* | 6/2004 | Moriyama | G06F 21/755 714/701 |

(Continued)

FOREIGN PATENT DOCUMENTS

| | | |
|---|---|---|
| EP | 2573716 A2 | 3/2013 |
| KR | 10-2008-0050210 A | 6/2008 |

OTHER PUBLICATIONS

International Search Report and Written Opinion Issued in International Application No. PCT/GB2020/050037, dated Apr. 15, 2020, 19 pages.

(Continued)

*Primary Examiner* — Hoai-An D. Nguyen
(74) *Attorney, Agent, or Firm* — Talem IP Law, LLP

(57) ABSTRACT

A sensor system includes a sensor having a charge storage device controllably connected to a voltage source under control of a signal under test; and a readout circuit coupled to the charge storage device to determine whether the pulse width of the signal under test has changed greater than a threshold amount according to a voltage at the charge storage device. In some cases, the determination of whether the pulse width of the signal under test has changed includes determining whether the voltage satisfies a condition with respect to a comparison voltage. In some cases, the determination of whether the pulse width of the signal under test has changed is based on a propagation delay through a delay chain, where the propagation delay is dependent on the voltage.

19 Claims, 8 Drawing Sheets

(56) References Cited

U.S. PATENT DOCUMENTS

| | | | |
|---|---|---|---|
| 2005/0165569 A1* | 7/2005 | Matsui | G01R 29/02 |
| | | | 702/79 |
| 2008/0125990 A1* | 5/2008 | Chang | G01R 31/3167 |
| | | | 702/69 |
| 2008/0309396 A1 | 12/2008 | Lee | |
| 2009/0252068 A1 | 10/2009 | Charles et al. | |
| 2010/0052651 A1* | 3/2010 | Kojima | G01R 31/31937 |
| | | | 324/76.12 |
| 2010/0118143 A1* | 5/2010 | Amir | H04N 7/188 |
| | | | 348/143 |
| 2012/0139577 A1 | 6/2012 | Lee | |
| 2017/0003809 A1* | 1/2017 | Kim | H03K 17/9622 |

OTHER PUBLICATIONS

Michael Weiner et al., "A Low Area Probing Detector for Power Efficient Security ICs", Lecture Notes in Computer Science, Jul. 3, 2014, pp. 185-197, vol. 8651, Springer Berlin Heidelberg.

\* cited by examiner

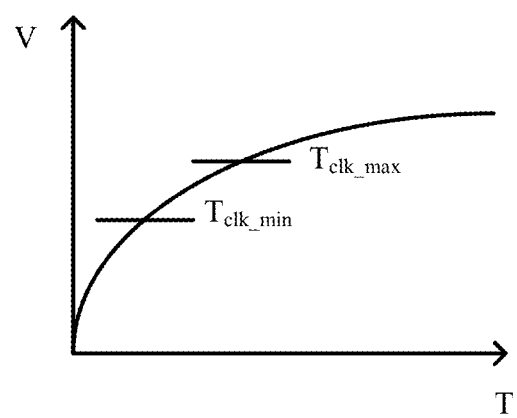
Figure 7
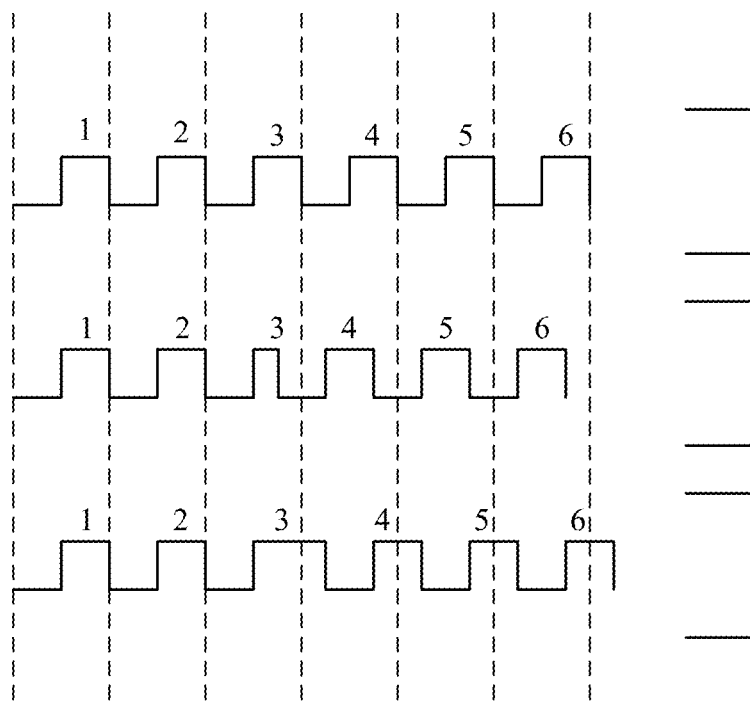
Figure 8A
Figure 8B
Figure 8C

DETECTION OF PULSE WIDTH TAMPERING OF SIGNALS

BACKGROUND

Tampering, or hacking, of an electronic system can give unauthorized users access to sensitive information. Such tampering can include access to sensitive information by unintended methods. One of the techniques that unauthorized users, or adversaries, may use to obtain such sensitive information is to exploit the vulnerabilities that exist due to the implementation of the designs in integrated circuits (ICs). For example, a vulnerability may exist that enables an adversary to perform side-channel analysis attacks or fault injection attacks.

Attacks by adversaries can include manipulation of the time bases, such as the clock signal, or other control signals, any of which may determine the functioning of sensitive operations. Manipulating the time bases is generally referred to as clock manipulation attacks. In a clock manipulation attack, an adversary manipulates the time base with an objective of causing unintended behavior of a system that can be used to compromise the security of the system. Similar effects are also experienced when other signals with expected pulse widths (e.g., some control signals) are manipulated in the same manner.

BRIEF SUMMARY

Detection of pulse width tampering of signals are provided. A sensor and method of using the sensor are described herein that can be employed in an electronic system to monitor a signal and determine if tampering of the signal with respect to the pulse width of the signal has occurred. The monitored signals can include, but are not limited to, clocking signals (e.g., system clocks or cryptographic clock) and control signals (e.g., reset). A monitored signal can be referred to as a "signal under test".

The sensor system described herein can include a sensor comprising a charge storage device (CSD) controllably connected to a voltage source under control of a signal under test (SUT), and a readout circuit coupled to the CSD. The SUT can directly or indirectly control the connection of the CSD to the voltage source. The readout circuit can determine whether the pulse width of the signal under test has changed greater than a threshold amount according to a voltage at the CSD. The voltage of the CSD is related to the pulse width of the SUT. Thus, the readout circuit can determine whether the pulse width of the SUT has been tampered with based directly or indirectly on the voltage of the CSD. For example, the readout circuit can determine a change in the pulse width of the SUT by determining whether the voltage read from the CSD (the "CSD voltage") satisfies a condition with respect to a comparison voltage. The condition may be whether the difference between the CSD voltage and the comparison voltage is greater than a predetermined amount. The readout circuit can include or be coupled to a comparator. As another example, the readout circuit can include a delay chain and can determine a change in the pulse width of the SUT based on propagation delay through the delay chain (which is dependent on the CSD voltage).

A method of operating the sensor can include capturing at least one duty cycle of a pulse width of the signal under test and evaluating the duty cycle to determine whether tampering has occurred. The evaluating of the duty cycle can include determining whether the CSD voltage satisfies the condition with respect to a comparison voltage. In some cases, a sensor enable signal is used to control when the sensor operates. The sensor can operate (to provide the monitoring for pulse width tampering) based on a periodic and pre-determined schedule, a random schedule, a triggering event, a triggering command, or a triggering environmental or operating condition.

In some cases, multiple sensors are used to monitor a signal under test, where the CSD voltage of each of the multiple sensors are compared to each other to ensure that the voltage is consistent within a tolerance band. In some cases, multiple sensors are used to monitor different signals under test, and the voltage values are compared to check relative consistency. In some cases, a CSD voltage of a single sensor or from multiple sensors are compared to a preset value or values.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 2A shows an implementation using a single switch and FIG. 2B shows an implementation using two switches.

FIG. 7 shows a graph of $V_{CSD}$ versus time.

FIG. 8A shows an example waveform of a signal that may be monitored for tampering.

FIGS. 8B and 8C show examples of pulse width tampering of the signal shown in FIG. 8A.

DETAILED DESCRIPTION

Detection of pulse width tampering of signals are provided. A sensor and method of using the sensor are described herein that can be employed in an electronic system to monitor a signal and determine if tampering of the signal with respect to the pulse width of the signal has occurred. The monitored signals can include, but are not limited to, clocking signals (e.g., system clocks or cryptographic clock), control signals, reset signals, status signals, command bus signals, and data bus signals. A monitored signal can be referred to as a "signal under test".

The described sensor and method of using the same as described herein may be implemented in any electronic system such as an integrated circuit (IC), a system on a chip (SOC), or a board level system that contains at least one signal providing a time base or other periodic signal with consistent pulse width.

Figure 1:
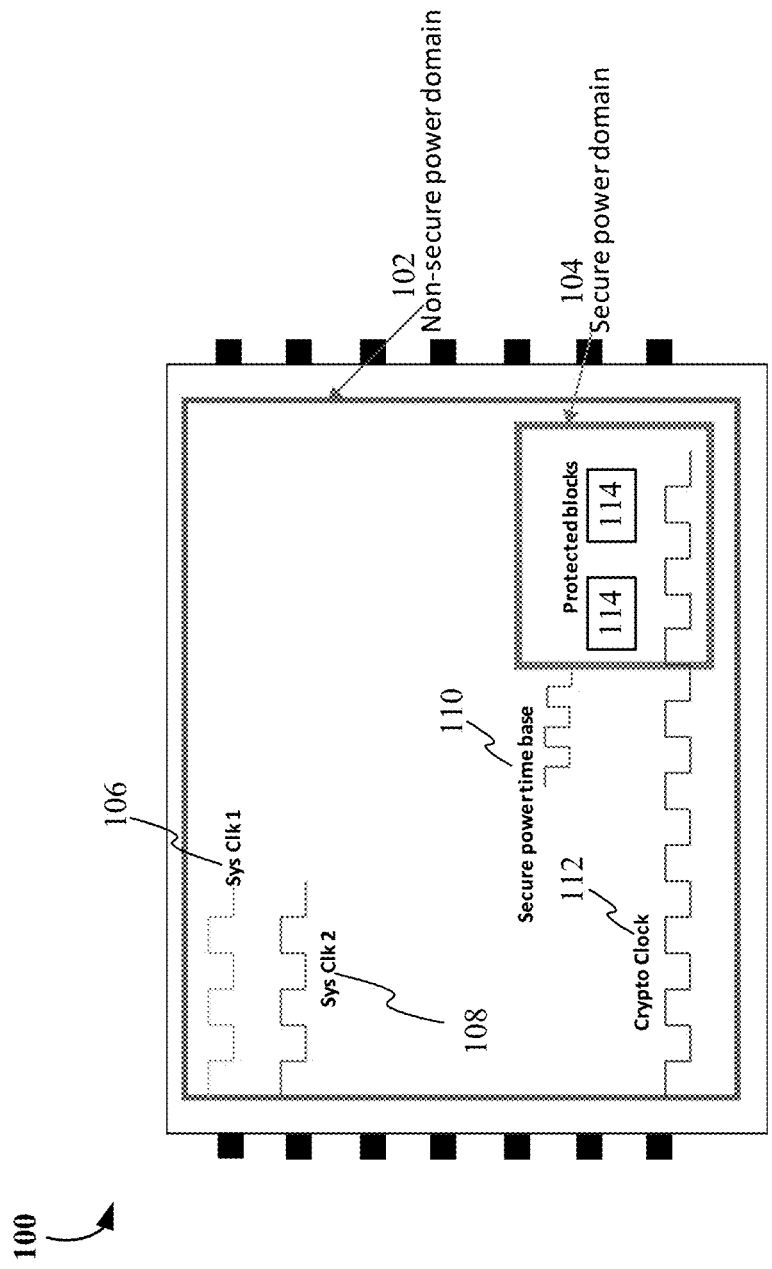
FIG. 1 shows an example electronic system that may incorporate the pulse width detection described herein.

FIG. 1 shows an example electronic system that may incorporate the pulse width detection described herein. The example electronic system 100 can have a non-secure power domain 102 and a secure power domain 104, where the power domains represent power supply mechanisms to the circuitry within their domains. That is, the electronic system 100 can include multiple time bases that may or may not be related to each other. For example, time bases for the non-secure power domain 102 operations may include, but are not limited to, system clocks such as Sys Clk 1 106 and Sys Clk 2 108. Time bases for secure power domain 104 operations may include, but are not limited to, a secure power time base (SPTB) 110, which may be used to control a charge distribution system for providing an isolated power supply for supplying power to sensitive circuitry (e.g., protected blocks 114), and a Cryptographic (Crypto) Clock 112. In addition, the electronic system 100 may generate or use other signals (not shown), including control signals such as reset signals, that may have expected periodic behavior with consistent pulse width.

An example of a protected block 114 can be a standard cryptographic cell implementing cryptographic operations such as AES. The secure power domain 104 may be derived from the non-secure power domain 102, independent of non-secure power domain 102, or isolated from the non-secure power domain 102. The protected circuit blocks 114 can be powered as part of the secure power domain 104 either partially or in its entirety for a portion of a time, or an entire time. For example, a secure power domain 104 may include a power supply formed of a protective charge storage device and control switches to control the power to the protected blocks 114. In some cases, a plurality of power supplies (e.g., a plurality of capacitors forming a capacitor system) can be used to supply power for the secure power domain 104. The output of the capacitor system can become the input to the protected blocks 114.

The described sensor and detection method are suitable for systems incorporating a secure power domain as it can be beneficial to be able to detect the clock manipulation attacks that are used to extract sensitive information. For example, the described sensor and detection method are suitable for detecting manipulation or tampering of the SPTB. However, the sensor system described herein can be implemented for any time base in the non-secure power domain 102 or secure power domain 104. Furthermore, multiple detection systems and/or sensors may be used to detect manipulation of multiple signals within the electronic system 100.

Figure 2A:
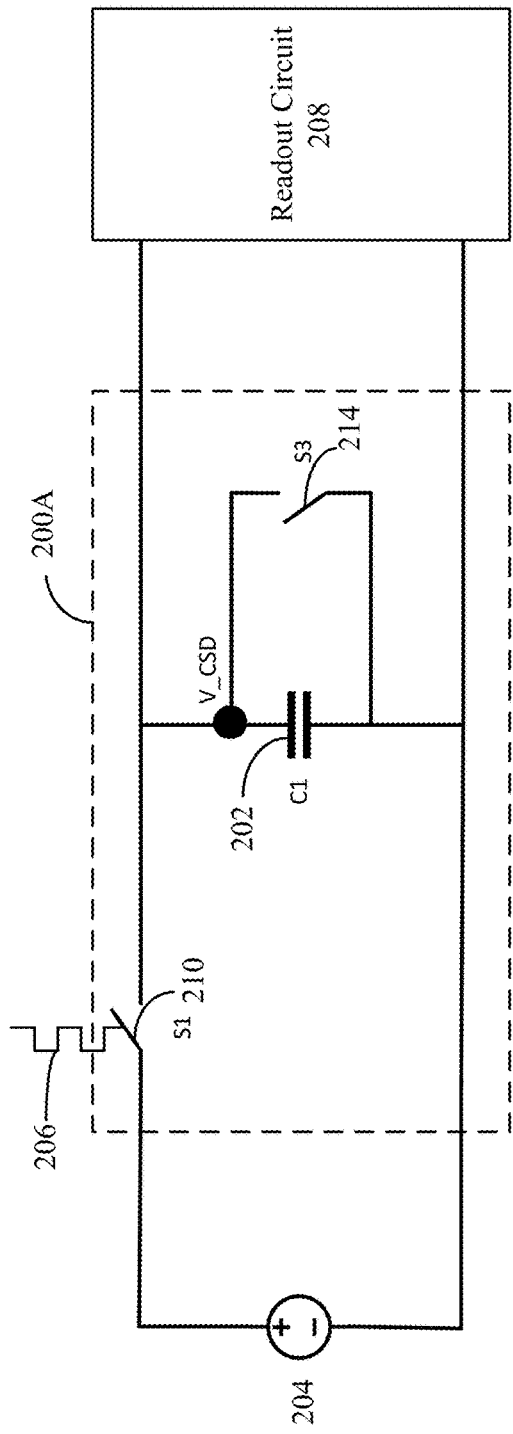
FIGS. 2A and 2B show example implementations of a sensor for detecting pulse width tampering.
Figure 2B:
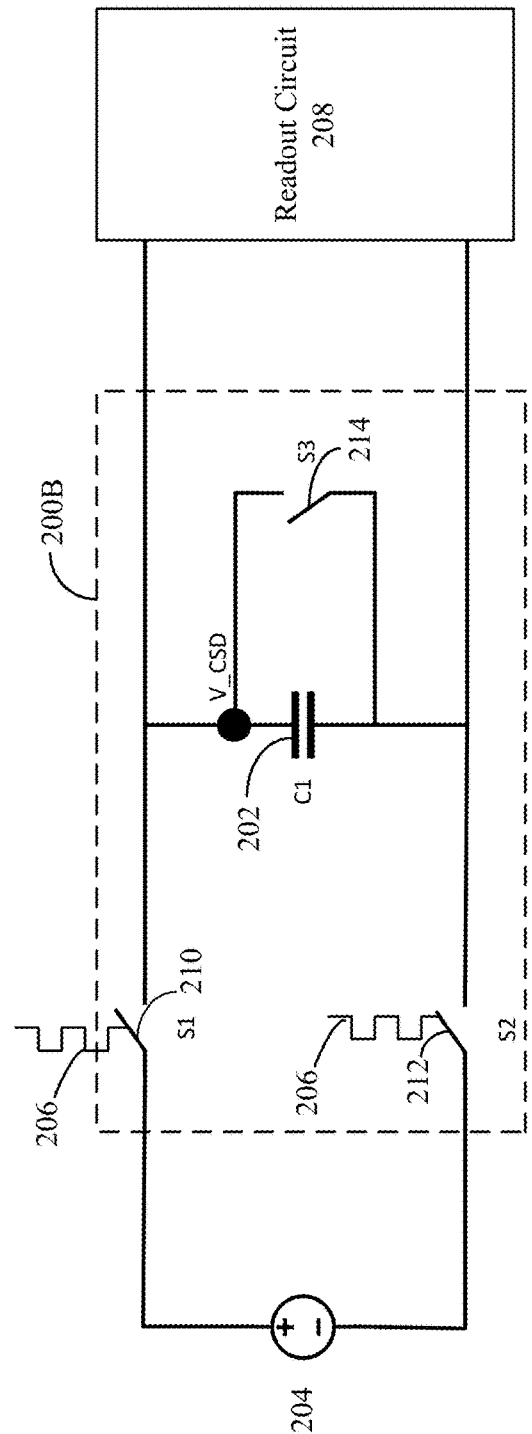

FIGS. 2A and 2B show example implementations of a sensor for detecting pulse width tampering. FIG. 2A shows an implementation using a single switch and FIG. 2B shows an implementation using two switches. Referring to FIG. 2A, a sensor 200A can include a charge storage device 202 controllably connected to a voltage source 204 under direct or indirect control of a signal under test 206. In some implementations, a clock signal can be used as the signal under test 206. Often, the clock signal is built as a balanced clock tree network; and the clock signal can directly or indirectly control whether the charge storage device 202 is connected to the voltage source 204.

Figure 2C:
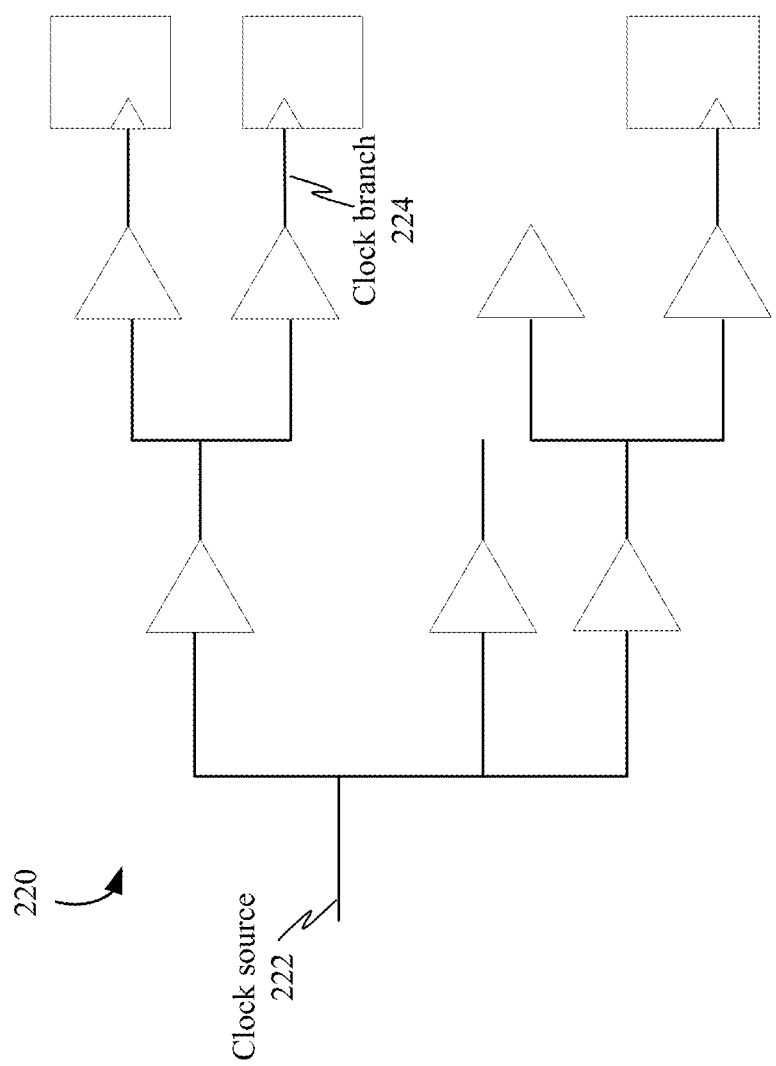
FIG. 2C shows an example implementation of a balanced clock tree network.

FIG. 2C shows an example implementation of a balanced clock tree network 220. The clock source signal 222 can directly controllably connect the charge storage device 202 to the voltage source 204 (e.g., by being tapped at the source). Alternatively, the clock source signal 222 can indirectly controllably connect the charge storage device 202 to the voltage source 204, for example, by being tapped at one of the branches. For example, one of the branches of the balanced clock tree network 224 can be used as the control signal (even though the clock source signal 222 is the intended signal under test in this illustrative scenario). It should be understood that direct/indirect control refers to whether it is the signal under test that is being used or a derivative signal and not whether there is a conditioning circuit (such as described below with respect to FIG. 3) or other components enabling the signal under test to be coupled to the sensor and switch circuitry.

A readout circuit 208 can be coupled to the charge storage device 202 to determine whether the pulse width of the signal under test has changed greater than a threshold amount according to a voltage at the charge storage device. The voltage of the charge storage device 202 is related to the pulse width of the signal under test 206. The readout circuit 208 determines whether the pulse width of the signal under test 206 has changed greater than a threshold amount, which can indicate tampering of the signal. For example, since the voltage of the charge storage device 202 is related to the pulse width of the signal under test 206, the readout circuit 208 can determine whether the pulse width of the signal under test 206 has been tampered with by determining whether the voltage ($V_{CSD}$) read from the charge storage device 202 satisfies a condition with respect to a comparison voltage. The condition may be whether the difference between the charge storage device voltage and the comparison voltage is greater than a predetermined amount. As will be described with respect to FIG. 6, the comparison voltage may be a reference voltage or may be a voltage from another charge storage device of another sensor. In some cases, the comparison voltage may be the charge storage device voltage, but from a different point in time (e.g., from the same sensor but another time).

In some cases, instead of directly reading the voltage off the charge storage device 202, the readout circuit 208 can indirectly read the voltage of the charge storage device by monitoring the effects of the voltage change. For direct monitoring, the voltage can be measured directly using analog measurement circuits. For indirect monitoring, readout circuit 208 can measure the frequency of an oscillator supplied by the voltage or can measure the propagation delay through a chain of gates powered by the voltage of the charge storage device 202 as some examples. The propagation delay of the chain of gates is proportional to the voltage of the charge storage device 202. Accordingly, in some cases, the readout circuit 208 includes a delay chain and can determine whether the pulse width of the signal under test has changed greater than the threshold amount based on propagation delay through the delay chain.

The voltage source 204 may be part of the sensor 200 or may be external to the sensor 200. The signal under test 206 can be, for example, the SPTB, crypto clock, reset signal, or any other pulse signal. The signal under test 206 can provide the input to a switch, S1 210, to controllably connect the voltage source 204 and the charge storage device 202. For example, when S1 210 is closed, charge storage device 202 can charge. Optionally, a second switch, S2 212, can be included in the sensor 200, such as provided for sensor 200B shown in FIG. 2B. Referring to both FIGS. 2A and 2B, a third switch, S3 214, can be coupled in parallel with the charge storage device 202. When S3 214 is closed, the charge in the charge storage device 202 can be discharged either partially or completely.

Switches S1, S2, and S3 can each be controlled by the characteristics of the signal under test 206. For example, S1 210 and S2 212 can both be controlled by the signal under test 206; and S3 214 can be controlled by the inverse signal of the signal under test (e.g., the inverted signal under test).

In FIGS. 2A and 2B, the charge storage device 202 is shown as a capacitor, however, other devices that are capable of holding a charge could also be used for the charge storage device.

Figure 3:
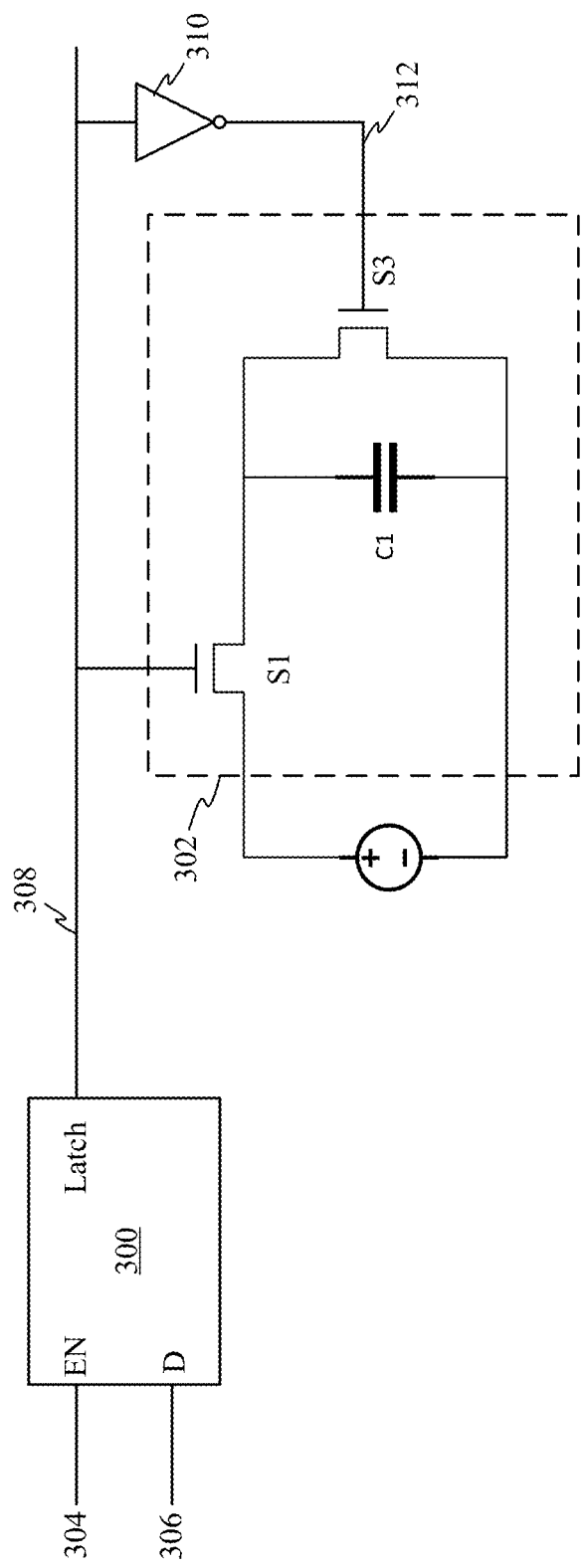
FIG. 3 shows an example implementation of a sensor with a conditioning circuit.

The sensor may or may not need to continuously monitor the signal under test. A command signal can be used to control monitoring of the signal under test. In some cases, a conditioning circuit can be coupled to the input of the sensor to control monitoring of the signal under test and remove transient signals for cleaner switching. FIG. 3 shows an example implementation of a sensor with a conditioning circuit. The conditioning circuit 300 can be, for example, a latching device. The conditioning circuit 300 can be used to latch the positive edge or negative edge of an incoming signal under test 306 and remove transient signals prior to the sensor 302 receiving the signal under test. The conditioning circuit can be coupled to receive a command signal 304 and the signal under test 306 (which may be a signal such as described with respect to signal 206 of FIGS. 2A and 2B). The conditioning circuit 300 can receive the command signal 304 from a processor. The processor can be either internal to the electronic system or external to the electronic system. Monitoring of the signal under test commences when the conditioning circuit 300 receives the command signal 304 from the processor.

The decision to send the command signal can be determined by one or more of the following methods: periodic and pre-determined schedule, randomly scheduled, triggered by an event, triggered by a command, or triggered by an environmental or operating condition. Upon receiving the command signal 304 to monitor the signal under test, the conditioning circuit 300 can latch the positive edge or negative edge of the signal under test 306 and output a transient-removed signal under test 308 to the sensor 302. In some cases, an inverter 310 can be coupled to the output of the conditioning circuit 300 to receive the transient removed signal under test 308 and provide the inverted signal under test 312 to the switch S3 (e.g., switch S3 214 of FIG. 2A or FIG. 2B). The inverter can be designed with an adequate delay time to permit measuring a voltage across the charge storage device, C1, after C1 has charged.

Figure 4:
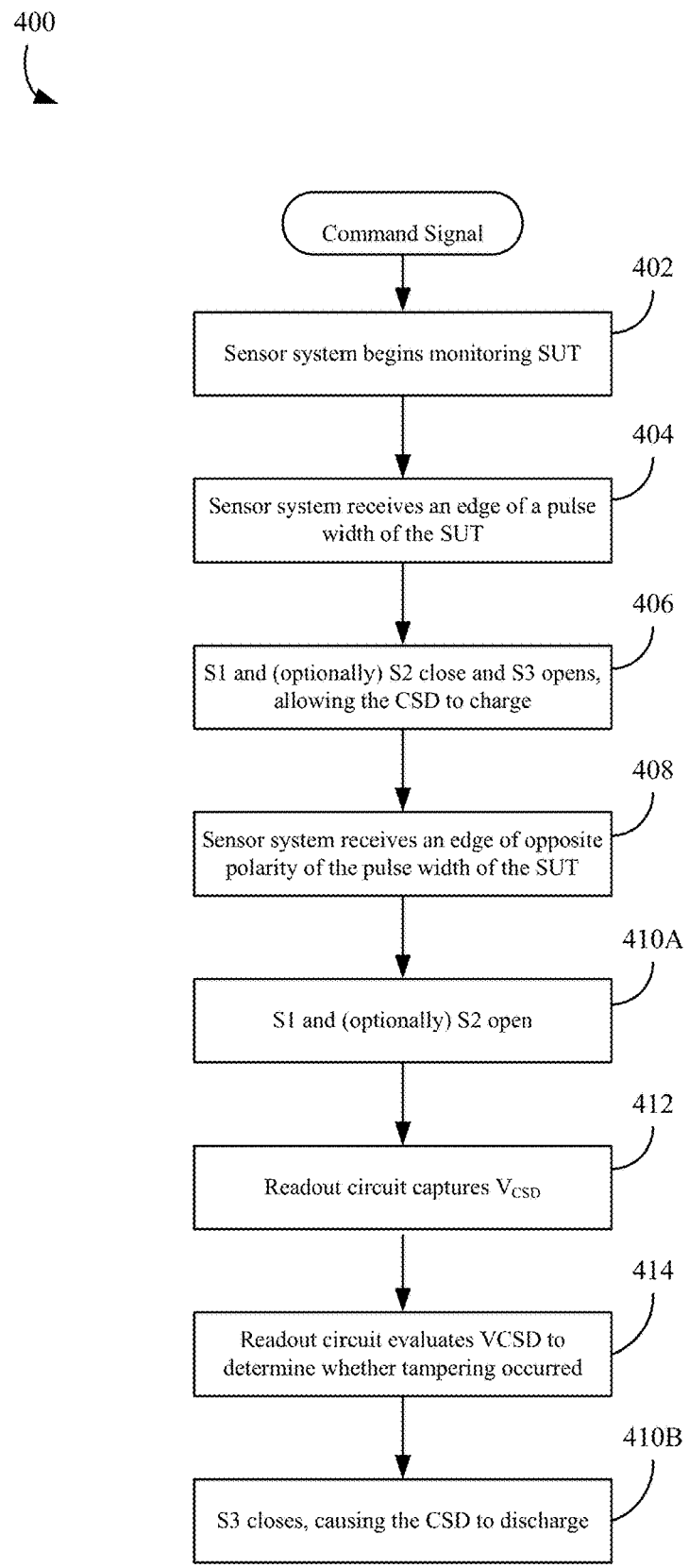
FIG. 4 shows a process flow for a method of pulse width detection using a sensing system as described herein.

A method of detecting pulse width tampering can include capturing a duty cycle of the pulse width of the signal under test and evaluating the duty cycle. FIG. 4 shows a process flow for a method of pulse width detection using a sensing system as described herein. The process 400 can be performed by a sensor system with a sensor and readout circuit such as described with respect to FIGS. 2A and 2B. In the particular example, a conditioning circuit 300 such as illustrated in FIG. 3 can be used to control when the sensor system begins monitoring. That is, when the sensor system includes a conditioning circuit, the method 400 commences when a command signal to begin monitoring is sent by a processor. Of course, the monitoring may be controlled by any suitable mechanism and even not require a trigger (e.g., the sensor system may run whenever there is power to the electronic system).

Once the sensor system begins monitoring the signal under test (SUT) (402), the sensor may receive a positive edge or a negative edge of a pulse width of the signal under test (404). Upon receiving the positive edge or negative edge of a pulse width, switch S1 and (optionally) S2 close and S3 opens, allowing the charge storage device (CSD) to begin charging (406). The CSD continues charging until the sensor receives an edge of opposite polarity of the pulse width (408). Upon receiving the edge of opposite polarity of the pulse width, switch S1 and (optionally) S2 open (410A). The switch S3 receives the inverted signal under test and therefore may close (410B) after a slight delay, causing the CSD to begin discharging. The CSD may discharge after receiving a first negative edge of the pulse width or the CSD may build charge for a specified number of multiple pulse cycles. If the CSD builds charge for a specified number of multiple pulse cycles, it will begin discharging upon the negative edge of the final pulse of the specified number of multiple pulse cycles. In any case, between the operations 410A and 410B resulting from the signal under test, the readout circuit captures the voltage off the CSD, $V_{CSD}$, (412). The readout circuit can capture the voltage $V_{CSD}$ while all switches are open, for example, due to the delay caused by the signal path of the signal under test through the inverter (or due to other circuitry controlling when the switch S3 is to be switched). In some cases, the readout circuit reads the voltage while the CSD is building charge such that the voltage is evaluated while the switches are closed for the duration of the pulse of the signal under test. Once $V_{CSD}$ is captured, the readout circuit evaluates $V_{CSD}$ to determine whether tampering has occurred (414). As mentioned above, the CSD then discharges (410B).

Figure 5:
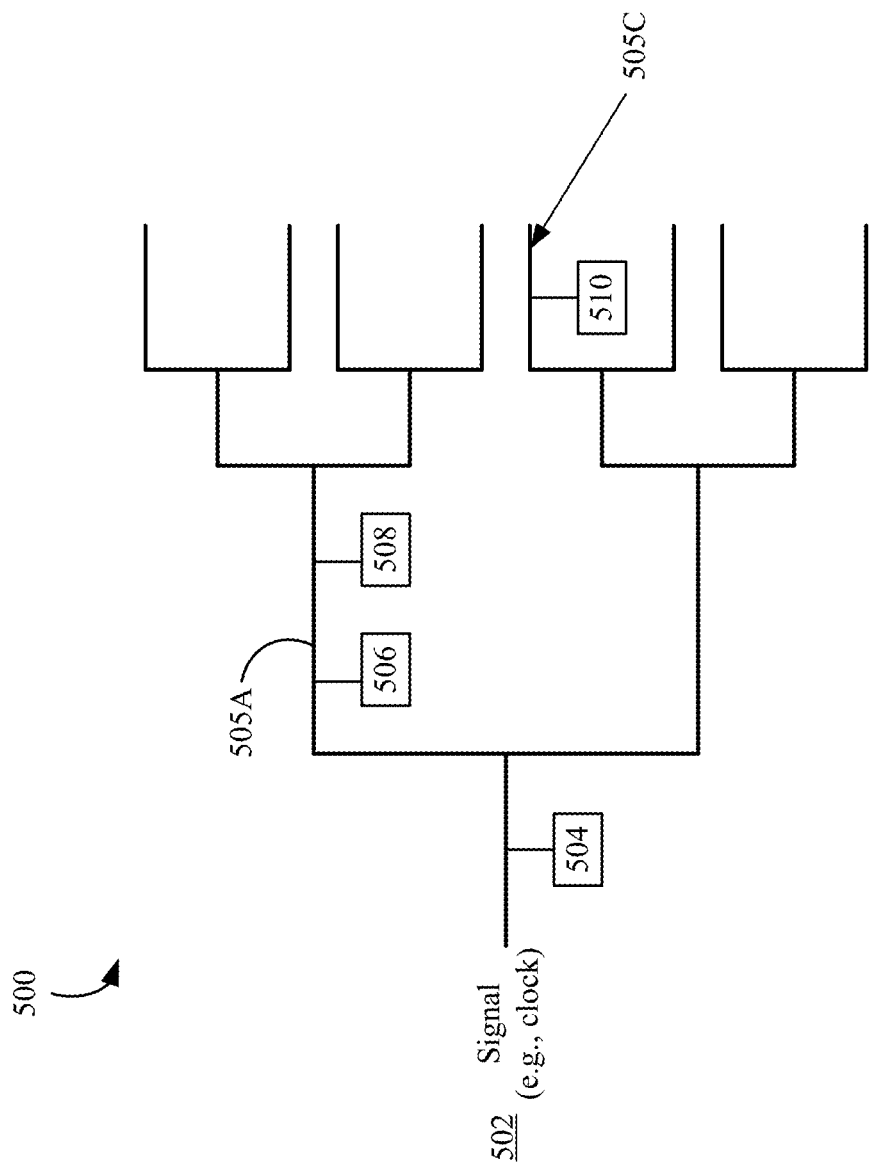
FIG. 5 shows an example implementation of a signal tree in an electronic system.

FIG. 5 shows an example implementation of a signal tree in an electronic system. The signal tree illustrated in FIG. 5 reflects an example pathway of a signal that may branch out through an electronic system. The described sensor may be coupled to any one of the branches in the tree. In some cases, multiple sensors may be positioned throughout an electronic system 500 to monitor the signal under test. The signal under test may be a time base 502 generated, for example, by circuit on a motherboard or other substrate (not shown) that an electronic system is disposed on or via an on-chip clock generator. A sensor 504 can be positioned to monitor the time base 502 prior to the branching of the signal tree (whether on chip or off chip). In some cases, a sensor 506 can be positioned on a branch 505A. Alternatively, multiple sensors, for example sensors 506 and 508, can be positioned on the same branch (e.g., 505A), or at different branches throughout the tree, such as sensor 508 on branch 505A and sensor 510 on branch 505C.

The time base 502 can be distributed to multiple functional blocks within an electronic system 500 according to the signal tree configuration such that different branches may operate using the original time base or a variation of the original time base. Each sensor in the signal tree can be coupled to a readout circuit that receives a $V_{CSD}$ value for that sensor. The voltage read from each sensor for a single branch (e.g., via sensors 506 and 508) can be compared to determine if the values of each sensor's $V_{CSD}$ is within a tolerance band.

In some cases, multiple sensors (e.g., 508 and 510) that are positioned on different branches (e.g., 505A and 505C) to monitor, for example, different time bases, can be evaluated. The readout circuits for each sensor can measure each sensor's $V_{CSD}$ and check the relative consistency of the time base characteristics, such as pulse width.

In some cases, a single readout circuit can be switchably coupled to a plurality of sensors.

In some cases, a plurality of sensors can have their $V_{CSD}$ compared to each other or to a preset reference value or a set of preset reference values stored in memory. The one or more readout circuits can include a single comparator circuit that can be used to compare $V_{CSD}$ values from multiple sensors to determine if the values are within a threshold amount.

Figure 6:
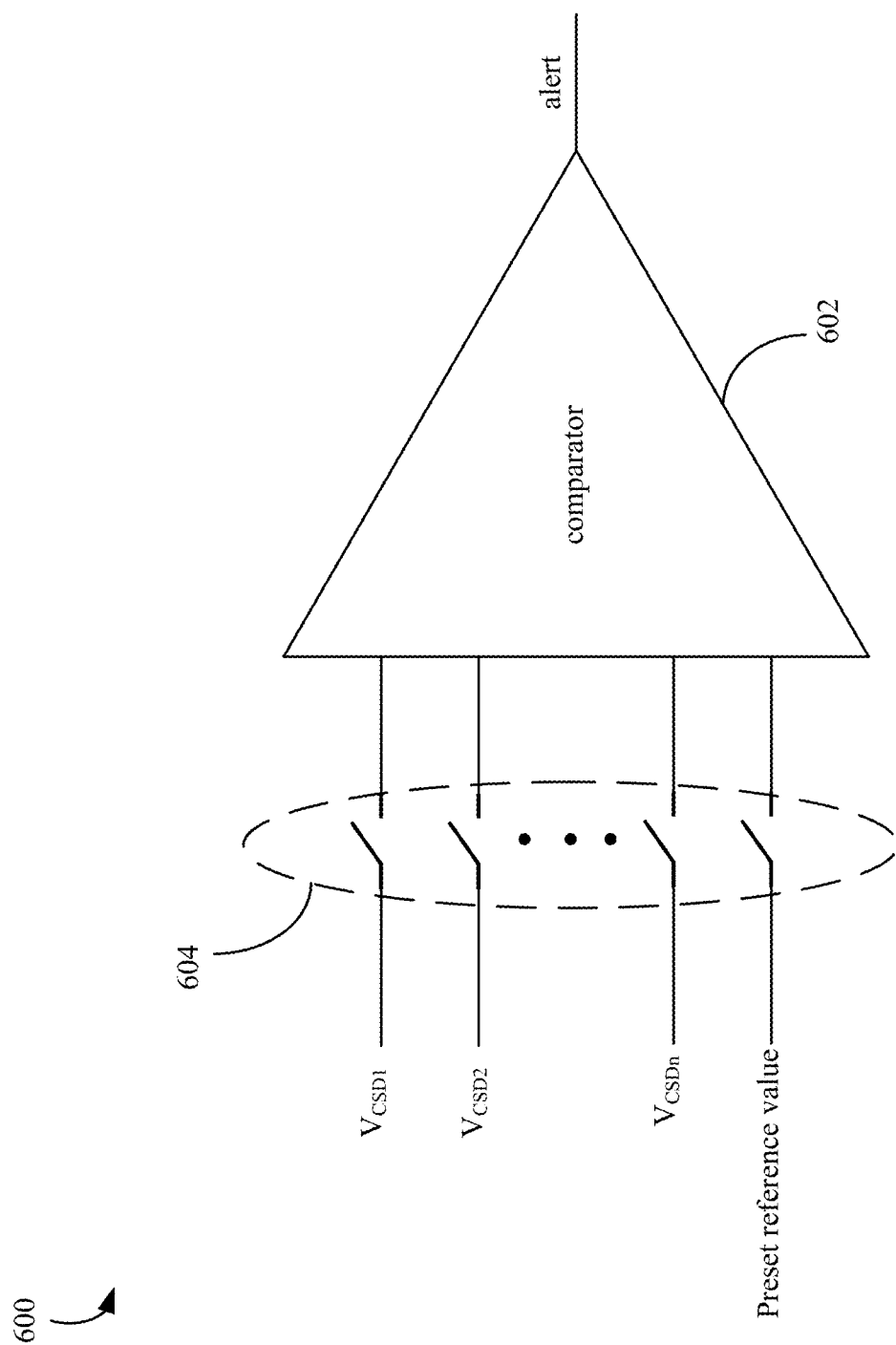
FIG. 6 shows an example implementation of a comparator for comparing $V_{CSD}$ values.

FIG. 6 shows an example implementation of a comparator for comparing $V_{CSD}$ values. The comparator system 600 can include a comparator 602 selectively coupled to receive multiple inputs. A controller (not shown) can selectively control the inputs to the comparator 602 using a switching mechanism 604. Switching mechanism 604 can be an array of switches. The controller may be a dedicated controller or part of the electronic system. The inputs can be $V_{CSD}$ values captured (via corresponding readout circuits) from different sensors throughout an electronic system. In some cases, one or more preset values stored in memory may be used as a reference voltage for the comparator 602.

The controller can selectively control the inputs to the comparator to compare $V_{CSD}$ values on different branches within a signal tree, $V_{CSD}$ values on the same branch of a signal tree, or $V_{CSD}$ values to a preset reference value. In some cases, a prior $V_{CSD}$ value is used as an input to the comparator to compare a current $V_{CSD}$ value with its $V_{CSD}$ value (which may be stored in a register or storage unit selectively coupled to the comparator 602 via the switching mechanism 604. The multitude of $V_{CSD}$ values are represented in FIG. 6 as $V_{CSD1}$, $V_{CSD2}$, . . . , $V_{CSDn}$. If the difference between the $V_{CSD}$ values is greater than a threshold value, the comparator 602 will output an "alert" signal to alert the electronic system of possible tampering. The electronic system can then initiate countermeasures to mitigate the damage from an attack. Alternatively, the comparator system 600 can include a multitude of comparators (not shown) to selectively compare multiple inputs at the same time. For example, the comparator system 600 can include a multitude of 2-input comparators to compare, two-by-two, the voltages from the multiple inputs.

FIG. 7 shows a graph of $V_{CSD}$ versus time. The value of $V_{CSD}$ is directly related to the time the CSD is allowed to charge. Referring to FIG. 7, the graph shows a voltage threshold range, $T_{clk\_max}$ and $T_{clk\_min}$, for values of $V_{CSD}$. The signal under test can be considered tamper-free if the value of $V_{CSD}$ is between these threshold values. As shown, $V_{CSD}$ increases with time until $V_{CSD}$ reaches a saturation point in which the maximum operating limit is reached, which is determined by the physical constraints of the CSD. If a pulse width is shorter than expected, the CSD will not be allowed to fully charge and $V_{CSD}$ will be below the threshold amount. Conversely, if a pulse width is longer than expected, the CSD will charge above the threshold amount.

FIG. 8A shows an example waveform of a signal that may be monitored for tampering; and FIGS. 8B and 8C show examples of pulse width tampering of the signal shown in FIG. 8A. Tampering is shown in duty cycle 3 for both FIGS. 8B and 8C. In FIG. 8B, the shortened duty cycle translates to a lower $V_{CSD}$ than expected. In FIG. 8C, the lengthened duty cycle translates to a higher $V_{CSD}$ than expected.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A sensor system comprising:
a sensor comprising a charge storage device controllably connected to a voltage source under control of a signal under test, wherein the charge storage device is controllably connected to the voltage source by at least one switch;
a conditioning circuit coupled to the at least one switch, wherein the conditioning circuit is coupled to receive a command signal and the signal under test and output a transient-removed signal under test to the at least one switch; and
a readout circuit coupled to the charge storage device to determine whether a pulse width of the signal under test has changed greater than a threshold amount according to a voltage at the charge storage device, wherein the voltage at the charge storage device is related to the pulse width of the signal under test.

2. The sensor system of claim 1, wherein the readout circuit comprises a comparator.

3. The sensor system of claim 1, wherein the signal under test is a clock signal, a reset signal, a control signal, a status signal, a command bus signal or a data bus signal.

4. The sensor system of claim 1, wherein the sensor further comprises a discharge switch coupled in parallel to the charge storage device.

5. The sensor system of claim 4, wherein the discharge switch is controlled by an inverted signal of the signal under test.

6. The sensor system of claim 1, wherein the readout circuit determines whether the pulse width of the signal under test has changed greater than the threshold amount by determining whether the voltage satisfies a condition with respect to a comparison voltage.

7. The sensor system of claim 6, wherein the comparison voltage is from the same sensor but from another time.

8. The sensor system of claim 6, wherein the comparison voltage is a reference voltage.

9. The sensor system of claim 6, wherein the comparison voltage is a voltage from another charge storage device of another sensor.

10. A sensor system comprising:
a sensor comprising a charge storage device controllably connected to a voltage source under control of a signal under test; and
a readout circuit coupled to the charge storage device to determine whether the pulse width of the signal under test has changed greater than a threshold amount according to a voltage at the charge storage device, wherein the voltage at the charge storage device is related to a pulse width of the signal under test, wherein the readout circuit comprises a delay chain, wherein the readout circuit determines whether the pulse width of the signal under test has changed greater than the threshold amount based on propagation delay through the delay chain, the propagation delay being dependent on the voltage.

11. A sensor system comprising:
an inverter coupled to receive a signal under test and output an inverted signal under test;
a sensor comprising:
a charge storage device;
a first switch controlled by the signal under test to couple and decouple the charge storage device to a power supply; and
a second switch controlled by the inverted signal under test to bypass the charge storage device such that the charge storage device is discharged when the second switch is on; and
a conditioning circuit coupled to the first switch and the inverter, wherein the conditioning circuit is coupled to receive a command signal and the signal under test and output a transient-removed signal under test to the first switch and the inverter.

12. The sensor system of claim 11, further comprising:
a readout circuit coupled to the charge storage device, wherein the readout circuit is configured to determine whether a pulse width of the signal under test has changed greater than a threshold amount according to a voltage at the charge storage device, wherein the voltage at the charge storage device is related to the pulse width of the signal under test.

13. The sensor system of claim 12, wherein the readout circuit determines whether the pulse width of the signal under test has changed greater than the threshold amount by determining whether the voltage satisfies a condition with respect to a comparison voltage.

14. The sensor system of claim 13, wherein the comparison voltage is a reference voltage.

15. The sensor system of claim 13, wherein the comparison voltage is a voltage from another charge storage device of another sensor.

16. The sensor system of claim 13, wherein the comparison voltage is from the same sensor but from another time.

17. The sensor system of claim 12, wherein the readout circuit comprises a delay chain, wherein the readout circuit determines whether the pulse width of the signal under test has changed greater than the threshold amount based on propagation delay through the delay chain, the propagation delay being dependent on the voltage.

18. The sensor system of claim 12, wherein the readout circuit comprises a comparator.

19. The sensor system of claim 11, wherein the signal under test is a clock signal, a reset signal, a control signal, a status signal, a command bus signal or a data bus signal.

* * * * *